United States Patent [19]

Eisenberg et al.

[11] Patent Number: 5,057,462
[45] Date of Patent: Oct. 15, 1991

[54] COMPENSATION OF LITHOGRAPHIC AND ETCH PROXIMITY EFFECTS

[75] Inventors: Juli H. Eisenberg, Allentown; Larry B. Fritzinger, Bethlehem; Chong-Cheng Fu, South Whitehall; Taeho Kook, Lower Macungie Township, Lehigh County; Thomas M. Wolf, Laurys Station, all of Pa.

[73] Assignee: AT&T Bell Laboratories, Murray Hill, N.J.

[21] Appl. No.: 413,356

[22] Filed: Sep. 27, 1989

[51] Int. Cl.$^5$ .................... H01L 21/312; H01L 21/47
[52] U.S. Cl. .................................. 437/229; 437/225; 430/296
[58] Field of Search .................. 437/229, 225; 430/296

[56] References Cited

U.S. PATENT DOCUMENTS

| | | | |
|---|---|---|---|
| 4,463,265 | 7/1984 | Owen | 430/296 |
| 4,610,948 | 9/1986 | Glendinning | 430/296 |
| 4,761,560 | 8/1988 | Glendinning | 250/492.2 |
| 4,814,244 | 3/1989 | Koguchi | 437/229 |

OTHER PUBLICATIONS

Wolf and Tauber, "Silicon Processing for the VLSI Era" vol. 1, Jun., 1987, pp. 555–564.
"Proximity Effects and Influences of Nonuniform Illumination in Projection Lithography", P. D. Robertson et al., *Proceedings of SPIE*, vol. 334 (1982), pp. 37–43.
"Variable Proximity Corrections for Submicron Optical Lithographic Masks", Y. Nissan-Cohen et al., *Digest of Technical Papers, 1987 Symposium on VLSI Technology, Karuizawa*, IEEE, 1987, pp. 13–14.
"Reactive Plasma Etching", R. J. Schutz, Chap. 5 in: *VLSI Technology*, 2nd. edition, S. M. Sze, ed., McGraw-Hill, New York, 1988.

*Primary Examiner*—Brian E. Hearn
*Assistant Examiner*—Laura M. Holtzman
*Attorney, Agent, or Firm*—John T. Rehberg

[57] ABSTRACT

In the manufacture of integrated-circuit devices, patterned features are made on a substrate by etching a deposited layer. The pattern comprises features which are closely spaced, as well as others which are more isolated. Etching is in approximate conformance with a lithographically defined resist pattern which in turn is in approximate conformance with a desired pattern. A processing parameter such as, e.g., resist layer thickness is chosen such that an etched pattern is obtained which approximates a desired pattern more closely than a lithographically defined resist pattern.

12 Claims, 2 Drawing Sheets

COMPENSATION OF LITHOGRAPHIC AND ETCH PROXIMITY EFFECTS

TECHNICAL FIELD

The invention is concerned with the manufacture of integrated-circuit devices comprising etched features.

BACKGROUND OF THE INVENTION

In the manufacture of integrated-circuit devices such as, e.g., semiconductor memory and logic chips, various forms of etching play a significant role in forming microscopic device features such as, e.g., conductor paths. Typically, such features are made by depositing a layer of a desired material on a substrate, further depositing a photosensitive "resist" layer, patterning the resist layer by projection imaging and developing, and transferring the developed pattern to the desired layer by etching. In the case of conductor paths, resulting features may serve, e.g., to supply electrical power, to define channel regions of metal-oxide-semiconductor (MOS) transistors, or to carry signals between points within a chip, or between the chip and its environment.

While, desirably, etched features such as conductor paths have uniform width, actually realized linewidth may vary for a number of reasons as related to lithographic processing as well as to etching. For example, lithographically defined width is influenced by projection lens imperfections (e.g., spherical aberration and focal curvature), by the lens resolution limit, by wafer non-flatness and wafer topography, by focus and exposure selection, by resist processing variations (e.g., with respect to development temperature, and resist contrast and thickness), by feature proximity to adjacent features, and by underlying topography. Also, linewidth as etched is influenced further by etch bias, by etch uniformity (run-to-run, wafer-to-wafer, as well as within a wafer), resist profile, resist processing, and by feature proximity.

With respect to uniformity of feature width, particular attention will be paid in the following to proximity effects which, as mentioned above, play a role in connection with lithography as well as with etching.

Lithographic proximity effects play a significant role especially when feature width and spacing approach the limit capability of photolithographic equipment, and such effects have received increasing attention as design-rule feature-size limit has been and continues to be reduced from one device generation to the next. With respect to the influence of lithographic proximity effects, see, e.g., P. D. Robertson et al., "Proximity Effects and Influences of Nonuniform Illumination in Projection Lithography", *Proceedings of SPIE*, Vol. 334 (1982), pp. 37-43 and Y. Nissan-Cohen et al., "Variable Proximity Corrections for Submicron Optical Lithographic Masks", *Digest of Technical Papers, 1987 Symposium on VLSI Technology, Karuizawa*, IEEE, 1987, pp. 13-14.

As to proximity effects affecting etching, such effects may be attributed to the formation of sidewall films during plasma etching, typically by deposition of polymeric materials, or redeposition of nonvolatile etch products; see, e.g., R. J. Schutz, "Reactive Plasma Etching", Chapter 5 in: *VLSI Technology*, 2nd edition, S. M. Sze, ed., McGraw-Hill, New York, 1988.

As discussed, proximity effects may lead to inaccurate delineation of patterns in a resist layer and, ultimately, to inaccurate feature dimensions. Thus, in the interest of faithful reproduction of specified features, it is desirable to minimize variability of etched feature size due to proximity effects, and the invention described below is motivated by such desire.

SUMMARY OF THE INVENTION

It has been discovered that, under preferred processing conditions, lithographic proximity effects are counteracted by etch proximity effects. In accordance with the invention, in the manufacture of integrated-circuit devices, patterned features are made on a substrate by etching a deposited layer. The pattern comprises features which are closely spaced, as well as others which are more isolated. Etching is in approximate conformance with a lithographically defined resist pattern which in turn is in approximate conformance with a desired pattern. A processing parameter such as, e.g., resist layer thickness is chosen such that inaccuracies in the resist pattern due to lithographic proximity effects are at least approximately compensated for by countervailing inaccuracies due to etch proximity effects. More specifically, the value of a processing parameter is chosen equal to or in the vicinity of an optimal value at which compensation is locally optimal.

The invention can be used in device manufacture involving patterning by projection of a reticle or mask pattern, one-to-one or reduced, as well as in direct-writing methods in which a pattern is generated in a resist layer, e.g., by a focused electron beam or laser beam. Furthermore, direct-writing applications of the invention include the production of masks, for optical as well as for x-ray lithography.

DETAILED DESCRIPTION

Figure 1:
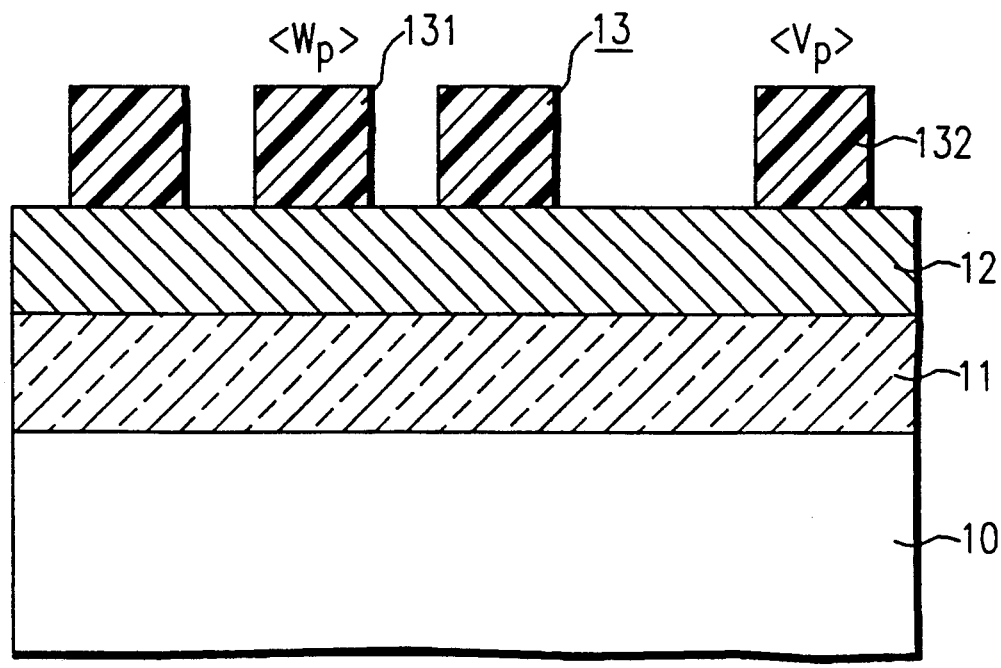
FIGS. 1 and 2 are schematic cross-sectional views of a device structure at different stages of processing.

A first preferred embodiment of the invention will be described in terms of producing conductor paths on a dielectric; for example, such paths may comprise metal or doped semiconductor material. For the quantitative assessment of proximity effects it is convenient to adopt a measure based on a simple test pattern such as a plurality of parallel conductor paths or "runners" whose nominal width is at or near the (design-rule) limit of photolithographic projection equipment, and whose spacing ranges from (design-rule) dense or packed to (many-times-design-rule) isolated. For example, in a device as suggested by FIG. 1, with substrate 10, dielectric layer 11, conductor layer 12, and patterned (organic) resist layer 13, resist feature 131 is in a packed environment, and resist feature 132 is isolated. Lithographic proximity effects arising in connection with projection imaging and with developing result in different as-developed feature widths $w_p$ in the packed case, and $v_p$ in the isolated case, and the difference $$\delta_p = W_p - V_p$$

can be taken as a measure for such lithographic effects.

Figure 2:
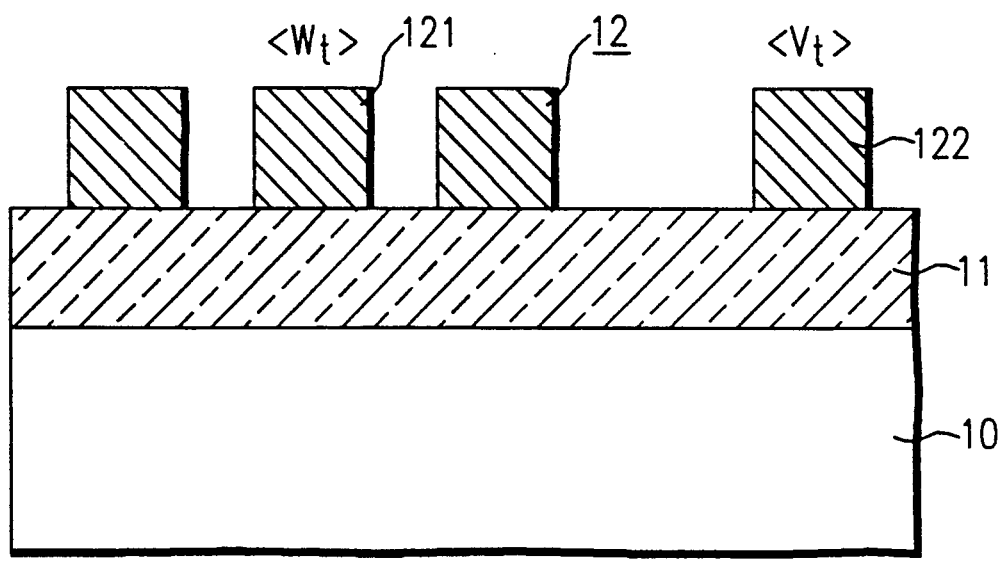

Upon transfer of the lithographic pattern by etching of the conductor layer (and after stripping of residual resist material) the device of FIG. 1 may take the form depicted in FIG. 2, etched feature widths $w_t$ of conductor 121, and $v_t$ of conductor 122 being designated in correspondence with lithographic feature widths $w_p$ and $v_p$. In analogy with the measure $\delta_p$ for lithographic proximity effects defined above, a measure for the combined lithographic and etching proximity effects can be defined by the difference $$\delta_t = W_t - V_t,$$

and finally, a measure for the etch-proximity effect can be defined as $$\delta_e = \delta_t - \delta_p.$$

The invention is predicated on the discovery that processing conditions or parameters can be chosen such that lithographic proximity effects are counteracted and even, optimally, fully compensated for or canceled out by etch proximity effects; in such preferred choices, both $\delta_p$ and $\delta_e$ are nonzero, and these two quantities are of opposite sign. One parameter which was found to be significant in this respect is photoresist layer thickness, such significance having been ascertained experimentally as follows:

On essentially flat wafer substrates covered with a 4000-angstrom silicon dioxide insulating layer, a 4200-angstrom phosphorus-doped polysilicon conductor layer was deposited. On different such substrates, Olin-Hunt ASPR238 photoresist layers having different thicknesses were deposited, namely layers having respective approximate thicknesses of 0.6, 1.1, and 2.0 micrometers. The resist layers were prebaked for approximately 60 seconds at a temperature of approximately 115 degrees C. on a hot plate. Identical, 0.6-micrometer design-rule test patterns comprising closely spaced as well as isolated features were photographically defined by projection with a lens having a numerical aperture of 0.40 and an illumination wavelength of 365 nanometers, and the exposed film was again baked under the same conditions as used for prebaking. The patterns were developed by immersion in Olin-Hunt LSI developer, diluted 1:1 with deionized water, at a temperature of approximately 23 degrees C. Developed photoresist linewidths were measured with an Amray 1500 scanning electron microscope: multiple samples were taken and averaged along a length of approximately 5 micrometers, and care was taken to measure base widths $w_p$ and $v_p$.

The developed pattern was transferred, by reactive sputter etching, into the doped polysilicon layer, using $CF_3Br/Cl_2$ chemistry in Tegal-1511e equipment. Etched linewidths $w_t$ and $v_t$ were determined by electrical probing by means of a Prometrix LithoMap® LM20 system, involving measurement of sheet resistance, and voltage drop measurements over an 80-micrometer distance.

Figure 3:
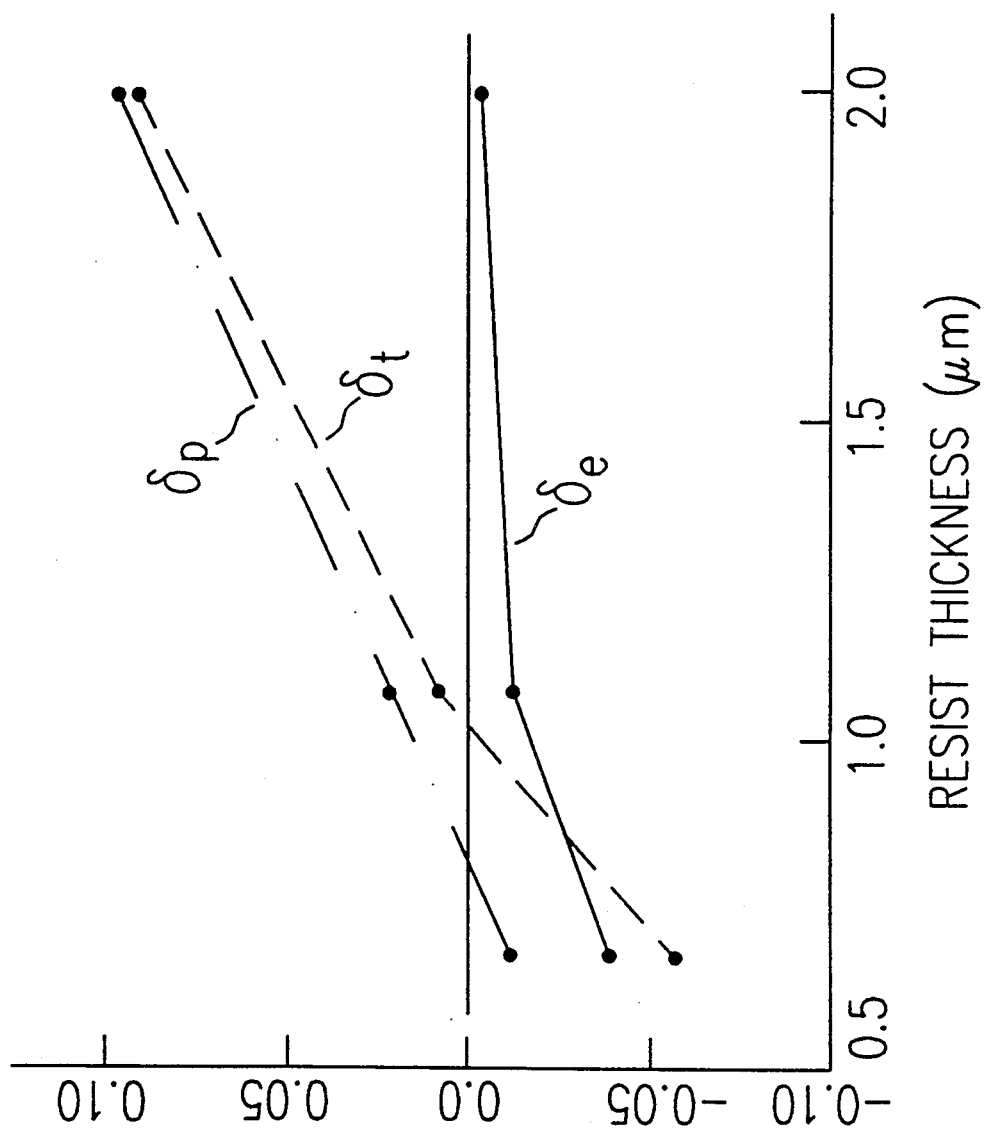
FIG. 3 is a graphical representation of experimental data illustrating the inventive concept as realized in exemplary processing.

The resulting quantities $\delta_p$, $\delta_t$, and $\delta_e$ as defined above are graphically shown in FIG. 3 as a function of resist layer thickness, and it can be seen that, for an approximate resist layer thickness of 1 micrometer, a lithographic proximity effect is compensated for by an etch proximity effect. More generally, the quantities $\delta_p$ and $\delta_e$ have opposite signs for resist thickness greater than approximately 0.75 micrometer, and particularly preferred proximity-effect compensation is realized for thicknesses in a preferred range from 0.9 to 1.1 micrometer. This is contrasted with prior-art typical resist-layer thickness of 1.2 micrometer and greater.

Since, for preferred relatively low resist layer thicknesses, a surface to be patterned preferably is sufficiently flat, and since flatness is assured in the case of masks, preferred processing of the invention is further applicable to mask making, e.g., by laser or electron-beam direct writing. Such masks may be made for optical or x-ray lithography, use of the invention for the latter being considered particularly promising in view of preferred use of plasma etching in the manufacture of x-ray masks—plasma (dry) etching also being preferred in connection with the invention.

Further among parameters having an influence on proximity effects, and being amenable to selection so as to result in at least partial compensation between lithographic and etch proximity effects, are resist prebake time and temperature, and developer temperature. In analogy to determination of optimal resist layer thickness as described above, other parameters can be chosen to minimize a quantity $\delta_t$ by offsetting a quantity $\delta_e$ against a quantity $\delta_p$, an optimal parameter value being chosen as a result of multiple measurements as the parameter varies through a range of interest. And, as in the case of layer thickness, a preferred range of parameter values may be defined in terms of an optimal parameter value, plus or minus 10 percent of such value. (For the optimal parameter value, the quantity $\delta_t$ may be zero as, e.g., in the case illustrated by FIG. 3; in other cases such optimal value may correspond to a nonzero local minimum of the magnitude of $\delta_t$.)

While a preferred embodiment of the invention as described above involves pattern-etching of polysilicon conductor material, preferred processing of the invention is applicable to other conductor materials such as, e.g., aluminum, tungsten, tungsten silicide, and tantalum silicide. Furthermore, such processing may be similarly applied to other materials such as, e.g., undoped semiconductor materials, and to dielectrics such as, e.g., silicon nitride and silicon dioxide. Also, while the invention currently may be of primary interest in patterning methods involving projection of a reticle pattern, its application in connection with direct-writing methods is also contemplated—as such methods, too, have been found to be subject to lithographic proximity effects.

Moreover, it is apparent that assessment of proximity effects in terms of long, narrow test features in packed and isolated environments is appropriate especially when desired etched features are similarly long and narrow. Where feature shape is dissimilar, on the other hand, it may be preferable to use other measures such as, e.g., feature diameter, again in packed and isolated environments. Finally, while in the case of projection imaging for photographic patterning, preferred processing in accordance with the invention may involve the use of projection masks or reticles with features in as-desired proportions, use of bias on such reticles is not precluded-the invention being of interest wherever, by some convenient measure, lithographic and etch proximity effects are countervailing.

We claim:

1. In the manufacture of integrated-circuit devices or of integrated-circuit projection masks, a process comprising selectively etching a layer of a desired material on a substrate, etching being in at least approximate conformance with a desired pattern which comprises a plurality of features, at least one of said features being in an environment in which lithographic as well as etch proximity effects are nonnegligible, etching being preceded by a step of lithographically producing a first pattern in a resist layer on said desired layer, said first pattern being in first approximate conformance with said desired pattern, and etching of said desired layer being such as to produce a second pattern in second approximate conformance with said first pattern, characterized in that the actual value of a processing parameter is chosen such that a lithographic proximity effect is at least partially compensated for by an etch proximity effect, and such that said actual value is at least approximately equal to an optimal value of said processing parameter, said optimal value being defined such that compensation of said lithographic proximity effect by said etch proximity effect is locally optimal; said processing parameter being resist layer thickness.

2. The method of claim 1, proximity effects being determined on the basis of the width of features in a packed environment and the width of isolated features, as developed in said resist layer and as etched in said layer of a desired material.

3. The method of claim 1 in which, at said optimal value, said lithographic proximity effect is canceled by said etch proximity effect.

4. The method of claim 1 in which etching is by plasma etching.

5. The method of claim 1 in which producing said first pattern comprises projecting a mask pattern.

6. The method of claim 1 in which said desired material comprises conductor material.

7. The method of claim 6 in which said conductor material comprises polysilicon.

8. The method of claim 6 in which said conductor material is selected from the group consisting of aluminum, tungsten, tungsten silicide, and tantalum silicide.

9. The method of claim 1 in which said desired material comprises a dielectric.

10. The method of claim 1 in which resist layer thickness is greater than 0.75 micrometer.

11. The method of claim 10 in which resist layer thickness is in the range from 0.9 to 1.1 micrometer.

12. In the manufacture of integrated-circuit devices or of integrated-circuit projection masks, a process comprising selectively etching a layer of a desired material on a substrate, etching being in at least approximate conformance with a desired pattern which comprises a plurality of features, at least one of said features being in an environment in which lithographic as well as etch proximity effects are nonnegligible, etching being preceded by a step of lithographically producing a first pattern in a resist layer on said desired layer, said first pattern being in first approximate conformance with said desired pattern, and etching of said desired layer being such as to produce a second pattern in second approximate conformance with said first pattern, characterized in that the actual value of a processing parameter is chosen such that a lithographic proximity effect is at least partially compensated for by an etch proximity effect, and such that said actual value is at least approximately equal to an optimal value of said processing parameter, said optimal value being defined such that compensation of said lithographic proximity effect by said etch proximity effect is locally optimal, said processing parameter being chosen from the group of: resist prebake time, resist prebake temperature, and developer temperature.

* * * * *